(12) United States Patent
Sun et al.

(10) Patent No.: US 12,543,486 B2
(45) Date of Patent: Feb. 3, 2026

(54) DISPLAY SUBSTRATE AND DISPLAY DEVICE

(71) Applicant: BOE Technology Group Co., Ltd., Beijing (CN)

(72) Inventors: Haiyan Sun, Beijing (CN); Xiaojin Zhang, Beijing (CN); Siqi Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 773 days.

(21) Appl. No.: 17/794,626

(22) PCT Filed: Aug. 30, 2021

(86) PCT No.: PCT/CN2021/115470
§ 371 (c)(1),
(2) Date: Jul. 22, 2022

(87) PCT Pub. No.: WO2023/028787
PCT Pub. Date: Mar. 9, 2023

(65) Prior Publication Data
US 2024/0206303 A1    Jun. 20, 2024

(51) Int. Cl.
*H10K 59/80* (2023.01)
*H10K 59/50* (2023.01)
*H10K 102/00* (2023.01)

(52) U.S. Cl.
CPC ......... *H10K 59/8793* (2023.02); *H10K 59/50* (2023.02); *H10K 59/873* (2023.02); *H10K 59/879* (2023.02); *H10K 2102/351* (2023.02)

(58) Field of Classification Search
CPC ...... H10K 50/85; H10K 50/856; H10K 59/50; H10K 59/8793; H10K 50/873; H10K 59/879
(Continued)

(56) References Cited

U.S. PATENT DOCUMENTS 5,596,246 A    1/1997 Budzilek et al.
7,169,447 B2 *  1/2007 Su Yu ................. G02B 5/3083
                                                 349/137
(Continued)

FOREIGN PATENT DOCUMENTS

CN    1591101 A    3/2005
CN    101852883 A  10/2010
(Continued)

*Primary Examiner* — Toan Ton
(74) *Attorney, Agent, or Firm* — Ling Wu; Stephen Yang; Ling and Yang Intellectual Property

(57) ABSTRACT

A display substrate and a display device are provided. The display substrate includes a light emitting element disposed on a base substrate, and an encapsulation layer, a connection layer, a light extraction layer, a polarization conversion layer and a polarization layer stacked sequentially at a light exiting side of the light emitting element. The light extraction layer is configured to convert at least a portion of light emitted by the light emitting element incident onto the light extraction layer into circularly polarized light with a set rotational direction to pass through the light extraction layer. The polarization conversion layer is configured to convert the circularly polarized light passing through the light extraction layer into linearly polarized light, with a polarization direction parallel to a direction of a light transmission axis of the polarization layer; the connection layer is configured to bond the light extraction layer to the encapsulation layer.

20 Claims, 4 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 11,631,835 B2* | 4/2023 | Wu | .................... | H10K 59/8791 |
| | | | | 257/40 |
| 2004/0051445 A1* | 3/2004 | Adachi | .............. | H10K 59/8791 |
| | | | | 313/504 |
| 2005/0035353 A1 | 2/2005 | Adachi et al. | | |
| 2009/0219472 A1* | 9/2009 | Fujita | .................. | G02F 1/13363 |
| | | | | 349/114 |
| 2010/0246368 A1 | 9/2010 | Oto | | |
| 2014/0097412 A1* | 4/2014 | Kuo | ................... | H10K 59/8791 |
| | | | | 257/40 |
| 2016/0033693 A1* | 2/2016 | Son | ...................... | G02B 5/3033 |
| | | | | 359/487.02 |
| 2016/0118448 A1* | 4/2016 | Epstein | ................. | H10K 59/12 |
| | | | | 257/40 |
| 2016/0211486 A1* | 7/2016 | Ohyama | ........... | G02F 1/133634 |
| 2017/0125743 A1 | 5/2017 | Kim et al. | | |
| 2017/0294628 A1* | 10/2017 | Kim | ..................... | H10K 50/844 |
| 2018/0006274 A1* | 1/2018 | Kim | ..................... | H10K 59/122 |
| 2019/0278120 A1 | 9/2019 | Smith et al. | | |
| 2019/0305254 A1* | 10/2019 | Kim | ..................... | H10K 59/875 |
| 2020/0185643 A1* | 6/2020 | Moon | ............... | G02F 1/133502 |
| 2022/0310969 A1 | 9/2022 | Fan et al. | | |
| 2023/0067641 A1* | 3/2023 | Zeng | ................. | H10K 50/8445 |

FOREIGN PATENT DOCUMENTS

| | | |
|---|---|---|
| CN | 107037522 A | 8/2017 |
| CN | 110262133 A | 9/2019 |
| CN | 110927857 A | 3/2020 |
| CN | 111710798 A | 9/2020 |
| CN | 112542494 A | 3/2021 |
| CN | 113036061 A | 6/2021 |
| WO | 2011030879 A1 | 3/2011 |

* cited by examiner

DISPLAY SUBSTRATE AND DISPLAY DEVICE

CROSS-REFERENCE TO RELATED APPLICATION

The present application is a U.S. National Phase Entry of International Application PCT/CN2021/115470 having an international filing date of Aug. 30, 2021 and entitled "Display Substrate and Display Device", and the contents disclosed in the above-mentioned application are hereby incorporated as a part of this application.

TECHNICAL FIELD

Embodiments of the present disclosure relate to, but are not limited to, the field of display technologies, and in particular to a display substrate and a display device.

BACKGROUND

Active matrix organic light emitting diodes (AMOLEDs) are widely used in terminal display products with high-resolution color screens due to their advantages such as self-luminescence, high contrast, wide viewing angle, high color gamut, fast response speed and low power consumption. Because electrodes with strong reflection characteristics are used in some organic light emitting diode (OLED) display panels, strong reflection occurring in external light in a bright field of view will decrease the contrast of panels greatly. Anti-reflection optical structures are usually used for improving visuality of the panels. However, linear polarizers are contained in the commonly used anti-reflection film layer structures, which will cause a great loss (not less than 50%) of the self-luminance of the panels, further resulting in many problems such as increased power consumption and loss of service life.

SUMMARY

The following is a summary of subject matters described herein in detail. The summary is not intended to limit the protection scope of the claims.

An embodiment of the present disclosure provides a display substrate, which includes a light emitting element disposed on a base substrate, and an encapsulation layer, a connection layer, a light extraction layer, a polarization conversion layer and a polarization layer which are stacked sequentially at a light exiting side of the light emitting element, wherein the light extraction layer is configured to convert at least a portion of light which is emitted by the light emitting element and incident onto the light extraction layer into circularly polarized light with a set rotational direction to pass through the light extraction layer; the polarization conversion layer is configured to convert the circularly polarized light passing through the light extraction layer into linearly polarized light, wherein a polarization direction of the linearly polarized light is parallel to a direction of a light transmission axis of the polarization layer; the connection layer is configured to bond the light extraction layer to the encapsulation layer, a thickness of the connection layer is greater than 3 times of a thickness of the light extraction layer, and a difference between a refractive index of the connection layer and a refractive index of a film layer of the encapsulation layer close to the connection layer is greater than 0.25.

The embodiment of the present disclosure further provides a display device including the display substrate described above.

Other aspects may be understood upon reading and understanding of the drawings and the detailed description.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of various components in the drawings do not reflect actual scales, and are only intended to schematically illustrate the contents of the present disclosure.

Reference numbers:
101 base substrate, 102 driving circuit layer, 103 light emitting structure layer, 210 driving transistor, 211 storage capacitor;
301 anode, 302 hole injection layer, 303 hole transport layer, 3041 electron block layer of red sub-pixel, 3042 electron block layer of green sub-pixel, 3043 electron block layer of blue sub-pixel, 3051 light emitting layer of red sub-pixel, 3052 light emitting layer of green sub-pixel, 3053 light emitting layer of blue sub-pixel, 306 hole block layer, 307 electron transport layer, 308 electron injection layer, 309 cathode;
310 light emitting element, 510 pixel definition layer;
601 encapsulation layer, 602 connection layer, 603 light extraction layer, 604 polarization conversion layer, 605 half-wave phase retardation film, 606 polarization layer.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall within the scope of the claims of the present disclosure.

Figure 1:
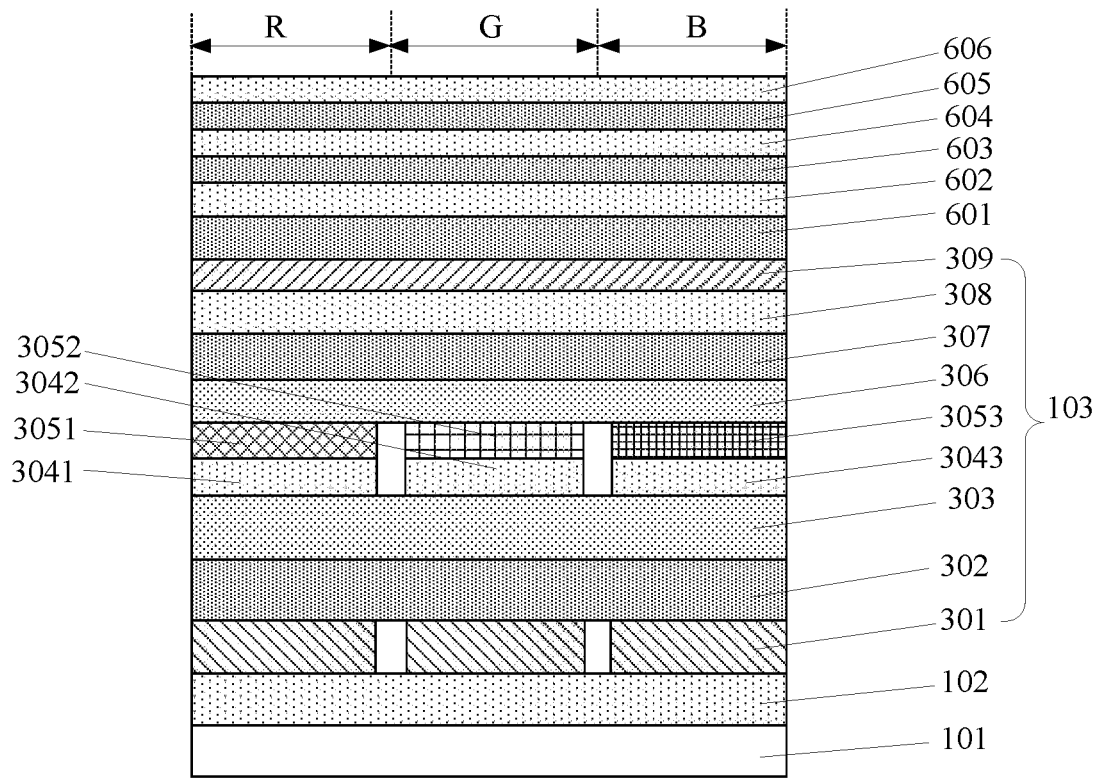
FIG. 1 is a schematic diagram of a film layer structure of a display substrate according to some exemplary embodiments.
Figure 2:
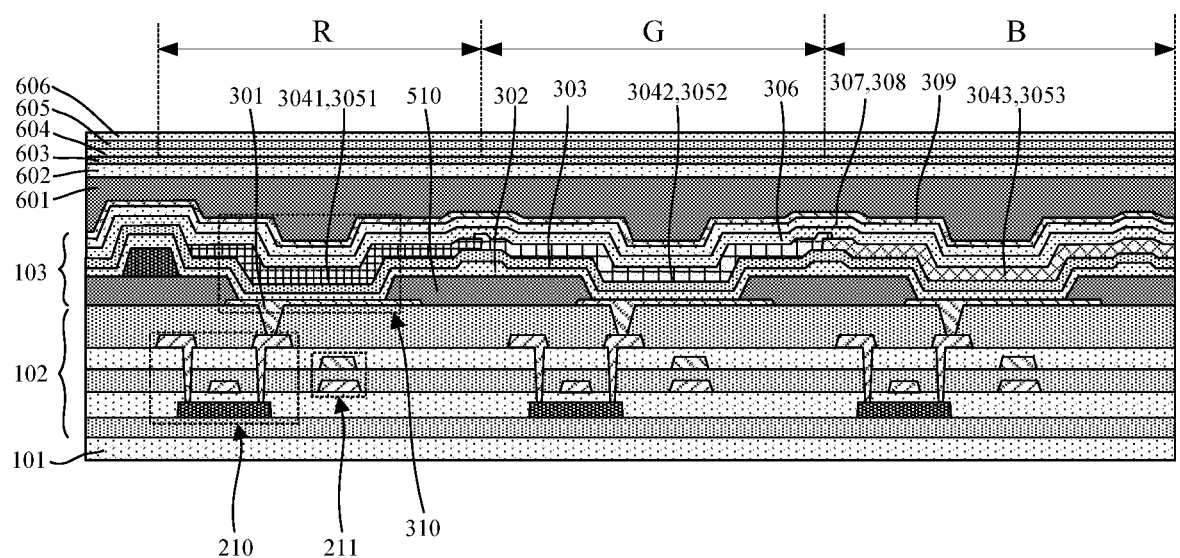
FIG. 2 is a schematic diagram of a cross-sectional structure of the display substrate in FIG. 1 according to some exemplary embodiments.
Figure 3:
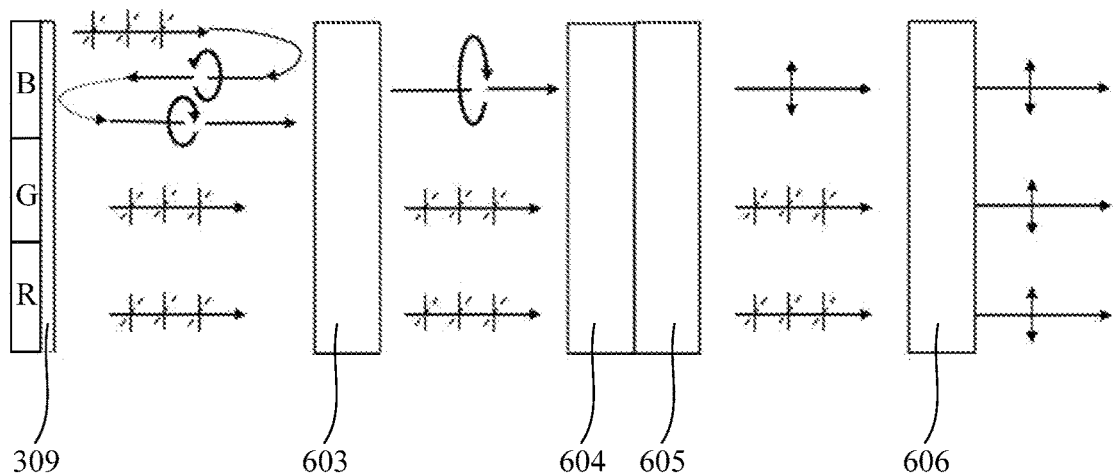
FIG. 3 is a schematic diagram showing that light emitted by light emitting elements of a red sub-pixel, a green sub-pixel and a blue sub-pixel passes through a light extraction layer, a polarization conversion layer, a half-wave phase retardation film and a polarization layer sequentially in a display substrate according to some exemplary embodiments.

An embodiment of the present disclosure provides a display substrate. As shown in FIGS. 1, 2 and 3, FIG. 1 is a schematic diagram of a film layer structure of a display substrate according to some exemplary embodiments, FIG. 2 is a schematic diagram of a cross-sectional structure of the display substrate in FIG. 1 according to some exemplary embodiments, and FIG. 3 is a schematic diagram showing that light emitted by light emitting elements of a red sub-pixel, a green sub-pixel and a blue sub-pixel passes through of a light extraction layer, a polarization conversion layer, a half-wave phase retardation film and a polarization layer sequentially in a display substrate according to some exemplary embodiments. The display substrate includes a light emitting element 310 (shown in FIG. 2) disposed on a base substrate 101, and an encapsulation layer 601, a connection layer 602, a light extraction layer 603, a polarization conversion layer 604 and a polarization layer 606 which are stacked at a light exiting side of the light emitting element 310 sequentially. The light extraction layer 603 is configured to convert at least a portion of light which is emitted by the light emitting element 310 and incident onto the light extraction layer 603 into circularly polarized light with a set rotational direction to pass through the light extraction layer 603. The polarization conversion layer 604 is configured to convert the circularly polarized light passing through the light extraction layer 603 into linearly polarized light, wherein a polarization direction of the linearly polarized light is parallel to a direction of a light transmission axis of the polarization layer 606. The connection layer 602 is configured to bond the light extraction layer 603 to the encapsulation layer 601, wherein a thickness of the connection layer 602 is greater than 3 times of a thickness of the light extraction layer 603, and a difference between a refractive index of the connection layer 602 and a refractive index of a film layer of the encapsulation layer 601 close to the connection layer 602 is greater than 0.25.

In the display substrate according to the embodiment of the present disclosure, the light extraction layer 603 is configured to convert at least a portion of the light which is emitted by the light emitting element 310 and incident onto the light extraction layer 603 into the circularly polarized light with the set rotational direction to pass through the light extraction layer 603, and the circularly polarized light passing through the light extraction layer 603 can be converted into the linearly polarized light, the polarization direction of the linearly polarized light is parallel to the direction of the light transmission axis of the polarization layer 606, such that the linearly polarized light can pass through the polarization layer 606 almost without loss. Thus, compared with schemes in some techniques in which the light emitted by the light emitting element 310 is emitted from the polarization layer 606 without being modulated by polarization, light loss can be reduced and a light emitting efficiency of the display substrate can be improved, thereby improving luminance of the display substrate and decreasing power consumption. In addition, setting the thickness of the connection layer 602 to be greater than 3 times of the thickness of the light extraction layer 603 and the difference between the refractive index of the connection layer 602 and the refractive index of the film layer of the encapsulation layer 601 close to the connection layer 602 to be greater than 0.25 is conducive to reducing loss of light when the light passes through the connection layer 602, not only the light emitting efficiency of the display substrate is improved, but also interference fringe phenomena occurring after external ambient light is incident onto the display substrate is reduced, thereby facilitating improvement in anti-reflection effect of the display substrate.

In some exemplary embodiments, as shown in FIG. 1, the refractive index of the connection layer 602 may be 1.35 to 1.65. The thickness of the connection layer 602 may be 5 μm to 40 μm, and the thickness of the light extraction layer 603 may be 1 μm to 30 μm. The connection layer 602 may play a part in assisting in light extraction and in bonding the encapsulation layer 601 to the light extraction layer 603.

In some exemplary embodiments, as shown in FIGS. 1 and 2, the display substrate may include multiple sub-pixels configured to display different colors, and each sub-pixel includes one light emitting element. Sub-pixels of three colors, which are respectively a red sub-pixel R, a green sub-pixel G and a blue sub-pixel B, are illustrated in FIG. 1. Taking the blue sub-pixel B as an example, the light emitting element 310 may include an anode 301, a light emitting layer 3053 and a cathode 309 which are stacked sequentially along a direction away from the base substrate 101. As shown in FIG. 3, the light extraction layer 603 is further configured to convert another portion of the light which is emitted by the light emitting element 310 and incident onto the light extraction layer 603 into circularly polarized light with a rotational direction opposite to the set rotational direction and reflect the light. The circularly polarized light with the rotational direction opposite to the set rotational direction reflected off the light extraction layer 603 is converted into circularly polarized light with the same rotational direction as the set rotational direction after it is reflected off the cathode 309, and can pass through the light extraction layer 603. Thus, the circularly polarized light reflected off the light extraction layer 603 can be retrieved by the reflection action of the cathode 309, thereby reducing the light loss and improving the light emitting efficiency. In other implementations, a reflective layer may be disposed at a side of the cathode 309 facing away from the base substrate 101 and is used for reflecting the circularly polarized light reflected off the light extraction layer 603.

In an example of this embodiment, as shown in FIGS. 1 and 2, the light emitting element 310 may be a top-emission OLED device. The anode 301 of the top-emission OLED device may be a composite film layer structure composed of a metal layer with high reflectivity and high work function and a transparent metal oxide layer, such as Ag/ITO (silver/indium tin oxide), Ag/IZO (silver/indium zinc oxide) or ITO/Ag/ITO, wherein a thickness of the metal layer may be 80 nm to 100 nm, and a thickness of the metal oxide layer may be 5 nm to 10 nm. An average reflectivity of the anode 301 in a visible light region may be 85% to 95%. The anode 301 may be formed through processes such as magnetron sputtering, etching, etc. The cathode 309 may be made of a metal material such as magnesium, silver or aluminum, or an alloy material (e.g., magnesium-silver alloy, in which a ratio of magnesium to silver may be 3:7 to 1:9). Transmittance of the cathode 309 to light of 530 nm may be 50% to 60%, thus a translucent cathode is formed. Alternatively, the cathode 309 may be made into a transparent cathode from a material such as a transparent oxide ITO, IZO, IGZO (indium gallium zinc oxide), etc. The cathode 309 may be formed by vacuum deposition and a thickness of the cathode 309 may be 10 nm to 20 nm. Materials of the light emitting layer may include a host material and a fluorescent guest material. In order to improve transmission capability of electrons and holes in the OLED device, taking the red sub-pixel R as an example, a hole injection layer 302, a hole transport layer 303 and an electron block layer 3041 stacked sequentially may be disposed between the anode 301 and the light emitting layer 3051, and a hole block layer 306, an electron transport layer 307 and an electron injection layer 308 stacked sequentially may be disposed between the light emitting layer 3051 and the cathode 309. All film layers between the anode 301 and the cathode 309 may be referred to as organic functional layers.

In an example of this embodiment, as shown in FIGS. 1 and 2, the light extraction layer 603 may include a cholesteric liquid crystal material (which may also be referred to as a chiral nematic liquid crystal) with a cured chiral direction (e.g., left-handed direction). Illustratively, the light extraction layer 603 includes a cholesteric liquid crystal layer, which may be a polymer stabilized cholesteric liquid crystal film material with a fixed rotational direction formed by photocuring a mixture of a nematic liquid crystal monomer having photopolymerization properties and a chiral agent (a doping ratio of the chiral agent may be less than 20%, for example, less than 10%), and the prepared cholesteric liquid crystal film material is adhered to a surface of the encapsulation layer 601 facing away from the base substrate 101 through the connection layer 602. The light extraction layer 603 may not contain a base material such as PET (polyethylene terephthalate) or PMMA (polymethyl methacrylate).

As shown in FIG. 3, the cholesteric liquid crystal layer (light extraction layer 603) may be configured to convert a portion (which may be 50%) of natural light in a set wavelength range (e.g., blue light) incident onto the cholesteric liquid crystal layer into circularly polarized light with a rotational direction (e.g., right-handed direction) opposite to its chiral direction to pass through the light extraction layer 603, and convert another portion (which may be 50%) of the natural light in the set wavelength range into circularly polarized light with a rotational direction (e.g., left-handed direction) same as its chiral direction and reflect it. The circularly polarized light with the rotational direction (e.g., left-handed direction) same as its chiral direction reflected off the cholesteric liquid crystal layer is reversed in rotational direction after it is reflected off the cathode 309 (e.g., left-handed direction is reversed to right-handed direction) to become circularly polarized light (e.g., right-handed direction) that can pass through the cholesteric liquid crystal layer. If the reflectivity of the cathode 309 is 50%, more than 75% of the light emitted by the light emitting element 310 can pass through the cholesteric liquid crystal layer and present a circular polarization property of a fixed rotational direction (e.g., right rotational direction). The circularly polarized light passing through the light extraction layer 603 is converted into the linearly polarized light after passing through the polarization conversion layer 604, and wherein a polarization direction of the linearly polarized light is parallel to a direction of the light transmission axis of the polarization layer 606, so that the natural light in the set wavelength range (e.g., blue light) can pass through the polarization layer 606 almost without loss. The cholesteric liquid crystal layer may further be configured such that there is no change in a polarization state of natural light outside the set wavelength range (e.g., red light and green light) incident onto the cholesteric liquid crystal layer, that is, the natural light outside the set wavelength range is still natural light after it is incident onto and pass throughs the cholesteric liquid crystal layer.

In display substrates based on some technologies, luminescent materials of red OLED devices and green OLED devices are selected as phosphorescent materials, while luminescent materials of blue OLED devices are selected as fluorescent materials due to life problems. Due to differences between luminescence mechanisms of phosphorescent materials and fluorescent materials, a fluorescence efficiency is far lower than a phosphorescent efficiency, so a light emitting efficiency of blue light of the display substrate is far lower than light extraction efficiencies of red light and green light. In some technologies, the light emitting efficiency of blue light of the display substrate is improve by optimizing a luminescence system of blue luminescent materials, but it is difficult to give consideration to both the efficiency and service life of blue OLED devices, therefore demands for mass production cannot be met.

In an embodiment of the present disclosure, the light extraction layer 603 may be configured to convert light in a wavelength range from 400 nm to 500 nm into circularly polarized light with a set rotational direction to pass through the light extraction layer 603. Transmittance of the light extraction layer 603 to light in the wavelength range from 400 nm to 500 nm is 35% to 65% (e.g., 40% to 55%), and transmittance of the light extraction layer 603 to light with a wavelength greater than 500 nm is larger than 90% (e.g., larger than 95%). Thus, because 400 nm to 500 nm is the wavelength range of blue light, as shown in FIG. 3, the light extraction layer 603 can convert a portion of blue light in the wavelength range from 400 nm to 500 nm emitted by the blue OLED device into the circularly polarized light with the set rotational direction to pass through the light extraction layer 603, and can convert another portion of the light into the circularly polarized light with a rotational direction opposite to the set rotational direction and reflect it, thereby improving the blue light emitting efficiency of the display substrate. The light extraction layer 603 is configured such that there is no change in polarization states of red light emitted by the red OLED device and green light emitted by the green OLED device, that is, the red light and the green light are still natural light after passing through the light extraction layer 603, and the transmittance of the light extraction layer 603 to the red light and the green light may be greater than 90%.

Figure 4:
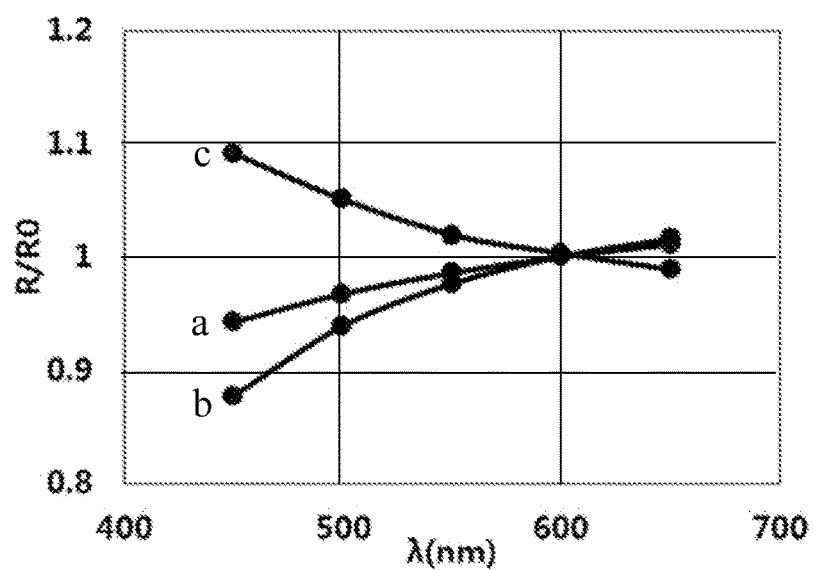
FIG. 4 is a curve graph of wavelength dispersion of three different polarization conversion film materials.

In some exemplary embodiments, as shown in FIGS. 1 and 2, the polarization conversion layer 604 may be a quarter-wave phase retardation film, which may have inverse wavelength dispersion, that is, as a wavelength of incident light increases, an optical path difference between o light (ordinary light) and e light (extraordinary light) occurring after birefringence of incident light by the quarter-wave phase retardation film increases, and accordingly, an optical path difference ratio $R/R_0$ increases, wherein R is an optical path difference between o light and e light occurring after the birefringence of the incident light by the quarter-wave phase retardation film, and $R_0$ is an optical path difference between o light and e light occurring after birefringence of incident light of a central wavelength (e.g., green light of 580 nm) by the quarter-wave phase retardation film. As shown in FIG. 4, FIG. 4 is a curve graph of wavelength dispersion of three different polarization conversion film materials, wherein optical path difference ratios $R/R_0$ of a polarization conversion film material a and a polarization conversion film material b which have inverse wavelength dispersion, increases as the wavelength of the incident light increases, and an optical path difference ratio $R/R_0$ of a polarization conversion film material c which has positive wavelength dispersion, decreases as the wavelength of the incident light increases.

Figure 5A:
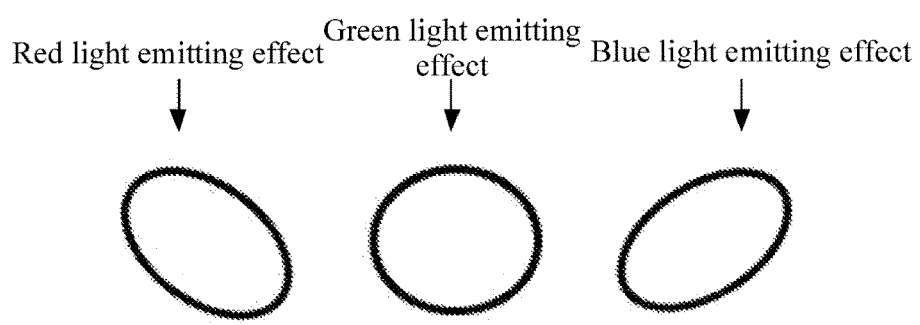
FIG. 5a is a schematic diagram showing a light emitting effect after external ambient light is incident from a polarization layer into a display substrate and emitted from a quarter-wave phase retardation film having positive wavelength dispersion.
Figure 5B:
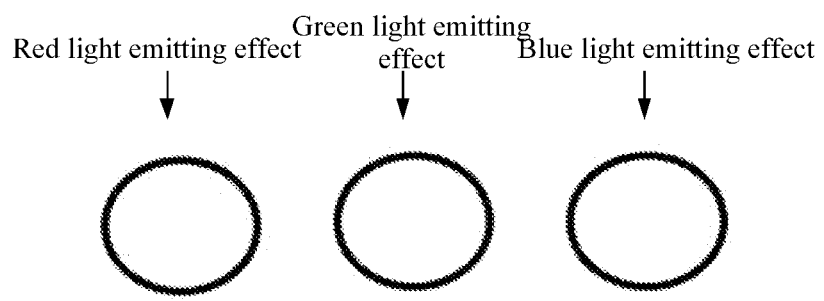
FIG. 5b is a schematic diagram showing a light emitting effect after external ambient light is incident from a polarization layer into a display substrate and emitted from a quarter-wave phase retardation film having inverse wavelength dispersion.

If the quarter-wave phase retardation film has positive wavelength dispersion, then after external ambient light is incident into the display substrate from the polarization layer and is emitted after passing through the polarization conversion layer, because a central wavelength (e.g., 580 nm) of the quarter-wave phase retardation film is green light, emitted light of the green light is approximately circularly polarized light, while emitted light of each of the red light and the blue light is elliptically polarized light, as shown in FIG. 5a. FIG. 5a is a schematic diagram showing a light emitting effect after the external ambient light is incident from the polarization layer into the display substrate and emitted from the quarter-wave phase retardation film having positive wavelength dispersion. Thus, after the elliptically polarized light of the red light and the blue light emitted from the polarization conversion layer is reflected off the cathode, then it is still elliptically polarized light after passing through the polarization conversion layer. A portion of the elliptically polarized light will be emitted from the polarization layer when passing through the polarization layer, so that a better anti-reflection effect cannot be achieved. In this embodiment, the quarter-wave phase retardation film has inverse wavelength dispersion, thus after the external ambient light is incident into the display substrate from the polarization layer and is emitted after passing through the polarization conversion layer, the emitted light of each of the red light, blue light and green light is close to circularly polarized light, as shown in FIG. 5b. FIG. 5b is a schematic diagram showing a light emitting effect after the external ambient light is incident from the polarization layer into the display substrate and emitted from the quarter-wave phase retardation film having inverse wavelength dispersion. After the circularly polarized light emitted from the polarization conversion layer is reflected off the cathode, it then becomes linearly polarized light after passing through the polarization conversion layer. A polarization direction of the linearly polarized light is perpendicular to a direction of a light transmission axis of the polarization layer, so the linearly polarized light cannot be emitted from the polarization layer, thereby achieving a good anti-reflection effect.

In an example of this embodiment, the quarter-wave phase retardation film can satisfy: $0.78 < R_B/R_0 < 1.1$, $0.9 < R_G/R_0 < 1.1$, and $1 < R_R/R_0 < 1.1$, wherein $R_0$ is an optical path difference between o light and e light occurring after birefringence of incident light of a central wavelength (e.g., green light of 580 nm) by the quarter-wave phase retardation film; $R_B$ is an optical path difference between o light and e light occurring after birefringence of the incident blue light by the quarter-wave phase retardation film; $R_G$ is an optical path difference between o light and e light occurring after birefringence of incident green light by the quarter-wave phase retardation film; $R_R$ is an optical path difference between o light and e light occurring after birefringence of incident red light by the quarter-wave phase retardation film.

In some exemplary embodiments, as shown in FIGS. 1 and 2, the display substrate may further include a half-wave phase retardation film 605 disposed between the polarization conversion layer 604 and the polarization layer 606. Thus, after the external ambient light is incident from the polarization layer 606 into the display substrate and passes through the half-wave phase retardation film 605 and the quarter-wave phase retardation film with inverse wavelength dispersion sequentially, the emitted light of the red light, blue light and green light will be closer to circularly polarized light, and then the circularly polarized light will be absorbed after being reflected off the cathode 309 and when finally passing through the polarization layer 606, such that the anti-reflection effect can be improved.

Illustratively, the polarization layer 606, the half-wave phase retardation film 605 and the polarization conversion layer (quarter-wave phase retardation film) 604 satisfy $\beta - 2\alpha = 45°$, wherein $\alpha$ is an angle between an optical axis of the half-wave phase retardation film 605 and the light transmission axis of the polarization layer 606, and $\beta$ is an angle between an optical axis of the polarization conversion layer 604 and the light transmission axis of the polarization layer 606; or $\alpha$ is an angle between the optical axis of the half-wave phase retardation film 605 and an absorption axis of the polarization layer 606, and $\beta$ is an angle between the optical axis of the polarization conversion layer 604 and the absorption axis of the polarization layer 606. Thus, it can be ensured that the circularly polarized light can be formed after the external ambient light passes through the polarization layer 606, the half-wave phase retardation film 605 and the polarization conversion layer 604 sequentially.

In some exemplary embodiments, the quarter-wave phase retardation film and the half-wave phase retardation film may be liquid crystal material layers or high polymer film layers. The liquid crystal material may be discoid liquid crystal or cholesteric liquid crystal material, and may be made into a film by coating.

In some exemplary embodiments, as shown in FIGS. 1 and 2, the encapsulation layer 601 includes multiple film layers stacked, and a refractive index of the encapsulation layer 601 may increase and decrease alternately along a direction away from the base substrate 101, which facilitates coupling output of the light emitted by the light emitting element 310, the light emitting efficiency of the display substrate is improved, and luminance at a positive viewing angle of the display substrate can also be improved. In addition, the reflection characteristic of the cathode 309 can also be improved, which facilitates retrieving the circularly polarized light reflected off the light extraction layer 603, thereby improving the light emitting efficiency of the display substrate.

In an example of this embodiment, a refractive index of one of any two adjacent film layers in the encapsulation layer is 1.3 to 1.7, and a refractive index of the other of the film layers is 1.7 to 2.3.

In some exemplary embodiments, the light emitting element includes an anode, a light emitting layer and a cathode stacked sequentially along the direction away from the base substrate. The display substrate further includes a covering layer (CPL) disposed between the cathode and the encapsulation layer (TFE). The encapsulation layer may include a first inorganic encapsulation layer, an organic encapsulation layer and a second inorganic encapsulation layer that are stacked sequentially along the direction away from the base substrate. the first inorganic encapsulation layer may include one or more film layers, wherein a refractive index of the first inorganic encapsulation layer is greater than a refractive index of the organic encapsulation layer in a case that the first inorganic encapsulation layer includes one film layer. A refractive index of a film layer in the first inorganic encapsulation layer close to the organic encapsulation layer is greater than the refractive index of the organic encapsulation layer in a case that the first inorganic encapsulation layer includes multiple film layers.

In an example of this embodiment, a difference between a refractive index of the covering layer and a refractive index of the film layer of the encapsulation layer close to the covering layer may be greater than 0.1.

In an example of this embodiment, the first inorganic encapsulation layer includes one film layer, wherein the refractive index of the first inorganic encapsulation layer may be greater than the refractive index of the covering layer (the covering layer may be one film layer); or the covering layer may include a first sub-covering layer and a second sub-covering layer which are stacked sequentially along the direction away from the base substrate, wherein a refractive index of the first sub-covering layer is greater than a refractive index of the second sub-covering layer, and a refractive index of the second sub-covering layer is less than the refractive index of the first inorganic encapsulation layer. Illustratively, a material of the covering layer is an aromatic amine-type or azine-type organic material (illustratively, the refractive indexes of the first sub-covering layer and the second sub-covering layer may be adjusted by adjusting differences in molecular structures of the organic materials forming the first sub-covering layer and the second sub-covering layer), a material of the first inorganic encapsulation layer is silicon nitride or silicon oxynitride, a material of the organic encapsulation layer is a resin material, and a material of the second inorganic encapsulation layer is silicon nitride or silicon oxynitride. Illustratively, in a case that the covering layer is one film layer, the refractive index of the covering layer may be 1.3 to 1.7, or in a case that the covering layer includes the first sub-covering layer and the second sub-covering layer, the refractive index of the first sub-covering layer may be 1.7 to 2.3, and the refractive index of the second sub-covering layer may be 1.3 to 1.7. The refractive index of the first inorganic encapsulation layer may be 1.7 to 2.3, the refractive index of the organic encapsulation layer may be 1.3 to 1.7, and the refractive index of the second inorganic encapsulation layer may be 1.7 to 2.3. In this example, a refractive index of a composite structure layer formed by a combination of the covering layer and the encapsulation layer may increase and decrease alternately along the direction away from the base substrate.

In an example of this embodiment, the first inorganic encapsulation layer may include a first sub-inorganic encapsulation layer and a second sub-inorganic encapsulation layer that are stacked sequentially along the direction away from the base substrate, wherein the refractive index of the first sub-inorganic encapsulation layer may be less than the refractive index of the second sub-inorganic encapsulation layer. The refractive index of the covering layer is greater than the refractive index of the first sub-inorganic encapsulation layer. Illustratively, a material of the first sub-inorganic encapsulation layer may be lithium fluoride or silicon dioxide, a material of the second sub-inorganic encapsulation layer may be silicon nitride or silicon oxynitride, a material of the organic encapsulation layer may be a resin material, and a material of the second inorganic encapsulation layer may be silicon nitride or silicon oxynitride. A material of the covering layer may be an aromatic amine-type or azine-type organic material. A thickness of the covering layer is 50 nm to 150 nm, a thickness of the first sub-inorganic encapsulation layer is 40 nm to 100 nm, a thickness of the second sub-inorganic encapsulation layer is 500 nm to 2000 nm, a thickness of the organic encapsulation layer is 5000 nm to 20000 nm, and a thickness of the second inorganic encapsulation layer is 400 nm to 1000 nm. For example, the thickness of the covering layer is 80 nm to 100 nm, the thickness of the first sub-inorganic encapsulation layer is 50 nm to 70 nm, the thickness of the second sub-inorganic encapsulation layer is 800 nm to 1200 nm, the thickness of the organic encapsulation layer is 8000 nm to 12000 nm, and the thickness of the second inorganic encapsulation layer is 500 nm to 700 nm. A total transmittance of the composite structure layer formed by the combination of the covering layer and the encapsulation layer to visible light can be no less than 90%. Alternatively, the materials of both the first sub-inorganic encapsulation layer and the second sub-inorganic encapsulation layer may be silicon oxynitride, and the refractive indexes of the first sub-inorganic encapsulation layer and the second sub-inorganic encapsulation layer may be adjusted by adjusting a ratio of nitrogen to oxygen in the silicon oxynitride forming the first sub-inorganic encapsulation layer and the second sub-inorganic encapsulation layer. Illustratively, the refractive index of the covering layer may be 1.7 to 2.3, the refractive index of the first sub-inorganic encapsulation layer may be 1.3 to 1.7, the refractive index of the second sub-inorganic encapsulation layer may be 1.7 to 2.3, the refractive index of the organic encapsulation layer may be 1.3 to 1.7, and the refractive index of the second inorganic encapsulation layer may be 1.7 to 2.3. In this example, the refractive index of the composite structure layer formed by the combination of the covering layer and the encapsulation layer may increase and decrease alternately along the direction away from the base substrate.

In some exemplary embodiments, as shown in FIGS. 1 and 2, the encapsulation layer 601 may include three or more than three stacked film layers, a difference between a refractive index of at least one of the film layers in the encapsulation layer 601 and the refractive index of the connection layer 602 is less than or equal to 0.2, and refractive indexes of at least two of the film layers in the encapsulation layer 601 are greater than 1.65.

Influences of connection layers of different thicknesses on the light transmittance and anti-reflection effect of the display substrate are compared below.

Embodiment 1: OLED light emitting element/encapsulation layer/connection layer 1 (10 μm)/light extraction layer (5 μm)/polarization conversion layer/polarization layer Embodiment 2: OLED light emitting element/encapsulation layer/connection layer 2 (25 μm)/light extraction layer (5 μm)/polarization conversion layer/polarization layer Film layer structure 1: polarization layer/polarization conversion layer/light extraction layer/connection layer 1 (thickness of which is 2 times that of light the extraction layer)

Film layer structure 2: polarization layer/polarization conversion layer/light extraction layer/connection layer 2 (thickness of which is 5 times that of the light extraction layer)

Figure 6:
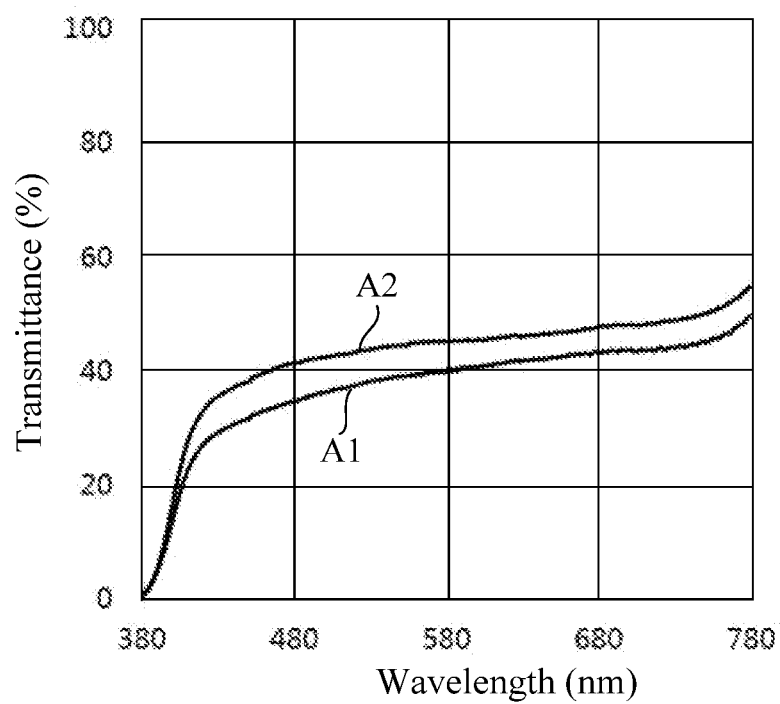
FIG. 6 is a curve graph of transmittance when connection layers with different thicknesses are used in a display substrate according to some exemplary embodiments.

As shown in FIG. 6, FIG. 6 is a curve graph of the transmittance of the display substrate of Embodiment 1 and Embodiment 2. Curve A1 is a curve of transmittance of the display substrate of Embodiment 1, and Curve A2 is a curve of transmittance of the display substrate of Embodiment 2. It can be seen that the transmittance of the display substrate of Embodiment 2 is significantly improved compared with the transmittance of the display substrate of Embodiment 1, and in addition, in a blue light wavelength range from 420 nm to 500 nm, increase in the transmittance of the display substrate of Embodiment 2 is higher than increase in the transmittance of the display substrate of Embodiment 1, which is more conducive to improving the light emitting efficiency of blue light.

Figure 7:
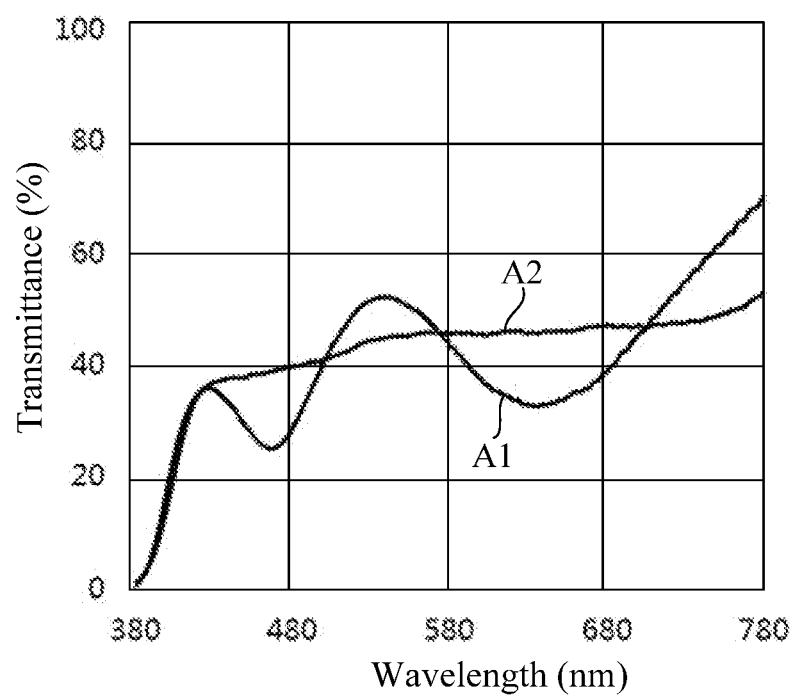
FIG. 7 is a curve graph of transmittance of related film layers to ambient light when connection layers with different thicknesses are used in a display substrate according to some exemplary embodiments.

As shown in FIG. 7, FIG. 7 is a curve graph of the transmittance of the above film layer structure 1 and film layer structure 2 to external ambient light. Curve A1 is a curve of transmittance of film layer structure 1 to the external ambient light, and Curve A2 is a curve of transmittance of film layer structure 2 to the external ambient light. It can be seen that when the external ambient light is incident, obvious interference fringes appear in film layer structure 1, but no obvious interference fringes appear in film layer structure 2, thus film layer structure 2 has better anti-reflection effect than film layer structure 1.

In some exemplary embodiments, as shown in FIGS. 1 and 2, the display substrate includes a display region including multiple pixel units arranged in an array, wherein the pixel units includes a red sub-pixel R, a green sub-pixel G and a blue sub-pixel B, and each sub-pixel includes a light emitting element 310. Any one of the encapsulation layer 601, the connection layer 602, the light extraction layer 603, the polarization conversion layer 604 and the polarization layer 606 of all sub-pixels in the display region is connected together to form an integrated structure and covers the display region.

In some exemplary embodiments, as shown in FIGS. 1 and 2, the display substrate includes a driving circuit layer 102, a light emitting structure layer 103, an encapsulation layer 601, a connection layer 602, a light extraction layer 603, a polarization conversion layer 604, a half-wave phase retardation film 605 and a polarization layer 606 that are stacked on the base substrate 101 sequentially. The driving circuit layer 102 includes multiple pixel driving circuits, and the light emitting structure layer 103 includes multiple light emitting elements 310, wherein each of the light emitting elements 310 is connected to a corresponding one of the pixel driving circuits. The display substrate may include multiple pixel units arranged in an array, wherein each pixel unit may include sub-pixels of multiple colors, multiple sub-pixels of the same color may be referred to as the same kind of sub-pixels, and each sub-pixel includes one light emitting element 310. Illustratively, the light emitting element 310 is a top-emission OLED device, and each pixel unit includes sub-pixels of three colors, such as a red sub-pixel R, a green sub-pixel G and a blue sub-pixel B. The light emitting element 310 of the sub-pixel of each color emits light of the color displayed by this sub-pixel, for example, the light emitting element 310 of the red sub-pixel R (which may be referred to as a red light emitting element) emits red light.

In some exemplary implementations, the base substrate 101 may be made of glass, transparent polyimide or other rigid or flexible base materials, and may have a refractive index of 1.3 to 1.5.

In some exemplary implementations, as illustrated in FIG. 2, the driving circuit layer 102 may include multiple transistors and a storage capacitor forming a pixel driving circuit. FIG. 2 is illustrated by taking each pixel driving circuit including one driving transistor 210 and one storage capacitor 211 as an example. In some implementations, the driving circuit layer 102 may include: a first insulating layer disposed on the base substrate 101; an active layer disposed on the first insulating layer; a second insulating layer covering the active layer; a gate electrode and a first capacitor electrode disposed on the second insulating layer; a third insulating layer covering the gate electrode and the first capacitor electrode; a second capacitor electrode disposed on the third insulating layer; a fourth insulating layer covering the second capacitor electrode; via holes being provided in the second insulating layer, the third insulating layer and the fourth insulating layer and exposing the active layer; a source electrode and a drain electrode disposed on the fourth insulating layer, with the source electrode and the drain electrode being respectively connected to the active layer through corresponding via holes; and a planarization layer covering the aforementioned structures, and via holes which expose the drain electrode are provided in the planarization layer. The active layer, the gate electrode, the source electrode and the drain electrode form the driving transistor 210, and the first capacitor electrode and the second capacitor electrode form the storage capacitor 211.

In some exemplary implementations, as shown in FIGS. 1 and 2, the light emitting structure layer 103 may include an anode 301, a pixel definition layer 510, a cathode 309 and an organic functional layer between the anode 301 and the cathode 309. The organic functional layer includes at least a light emitting layer (the light emitting layer of the red sub-pixel R is 3051, the light emitting layer of the green sub-pixel G is 3052, and the light emitting layer of the blue sub-pixel B is 3053 in the examples of FIGS. 1 and 2). The organic functional layer may further include a hole injection layer 302, a hole transport layer 303, an electron block layer (the electron block layer of the red sub-pixel R is 3041, the electron block layer of the green sub-pixel G is 3042, and the electron block layer of the blue sub-pixel B is 3043 in the examples of FIGS. 1 and 2), a hole block layer 306, an electron transport layer 307 and an electron injection layer 308. The anode 301 is disposed on the planarization layer of the driving circuit layer 102, and is connected to the drain electrode of the driving transistor 210 through a via hole provided in the planarization layer. The pixel definition layer 510 is disposed at one side of the anode 301 facing away from the base substrate 101, and a pixel opening is provided in the pixel definition layer 510. The pixel definition layer 510 covers a portion of a surface of the anode 301 close to a circumferential edge, and the pixel opening exposes the remaining portion of the surface of the anode 301. Multiple film layers of the organic functional layer and the cathode 309 are stacked sequentially on the portion of the surface of the anode 301 exposed by the pixel opening. The anode 301, the organic functional layer and the cathode 303 of each sub-pixel form an OLED device (light emitting element) which is configured to emit light of a corresponding color under driving of the corresponding pixel driving circuit. The light emitting structure layer 103 may further include other film layers, such as spacer pillars disposed on the pixel definition layer 510.

In some exemplary implementations, as shown in FIGS. 1 and 2, the display substrate including the OLED device may be manufactured using the following manufacturing method. First, the driving circuit layer 102 is formed on the base substrate through a patterning process. The driving circuit layer 102 may include the driving transistor 210 and the storage capacitor 211 forming the pixel driving circuit. Then, the planarization layer is formed on the base substrate on which the aforementioned structures are formed, and the via hole exposing the drain electrode of the driving transistor 210 is formed on the planarization layer. Then, multiple anodes 301 are formed through a patterning process on the base substrate on which the aforementioned structures are formed, and the anode 301 of each sub-pixel is connected to a drain electrode of a driving transistor 210 of the corresponding pixel driving circuit through a via hole in the planarization layer. Then, the pixel definition layer 510 is formed through a patterning process on the base substrate on which the aforementioned structures are formed, and the pixel opening exposing the anode 301 is formed in the pixel definition layer 510 of each sub-pixel, wherein each pixel opening is used as a light emitting region of the corresponding sub-pixel. Then, on the base substrate on which the aforementioned structures are formed, the hole injection layer 302 and the hole transport layer 303 are coated by evaporation subsequently using an open mask. The hole injection layers 302 and the hole transport layers 303 are intercommunicated layers, that is, the hole injection layers 302 of all the sub-pixels are connected as a whole, and the hole transport layers 303 of all the sub-pixels are connected as a whole. The hole injection layers 302 and the hole transport layers 302 have approximately same area, but different thicknesses. Then, the electron block layer 3041 and the light emitting layer 3051 of the red sub-pixel R, the electron block layer 3042 and the light emitting layer 3052 of the green sub-pixel G and the electron block layer 3043 and the light emitting layer 3053 of the blue sub-pixel B are coated by evaporation respectively in the red sub-pixel R, the green sub-pixel G and the blue sub-pixel B using a fine metal mask. The electron block layers and the light emitting layers of adjacent sub-pixels may overlap slightly with or be isolated from each other. Then, the hole block layer 306, the electron transport layer 307, the electron injection layer 308 and the cathode 309 are coated by evaporation sequentially using an open mask. The hole block layers 306, the electron transport layers 307, the electron injection layers 308 and the cathodes 309 are all intercommunicated layers, that is, the hole block layers 306 of all the sub-pixels are connected as a whole, the electron transport layers 307 of all the sub-pixels are connected as a whole, the electron injection layers 308 of all sub-pixels are collected as a whole, and the cathodes 309 of all the sub-pixels are collected as a whole. Thereafter, the encapsulation layer 601, the connection layer 602, the light extraction layer 603, the polarization conversion layer 604, the half-wave phase retardation film 605 and the polarization layer 606 are formed sequentially at one side of the cathode 309 facing away from the base substrate 101.

In some exemplary implementations, the light emitting layer may be coated by evaporation in a multi-source co-evaporation manner to form the light emitting layer containing a host material and a dopant material, wherein the dopant material may be a fluorescent luminescent material. A doping concentration of the dopant material may be regulated and controlled by controlling an evaporation rate of the dopant material or by controlling a ratio of an evaporation rate of the host material to that of the dopant material.

In some exemplary implementations, the hole injection layer may be made of at least one of HATCN (2,3,6,7,10, 11-hexacyano-1,4,5,8,9,12-hexaazatriphenylene) and CuPc (copper phthalocyanine). The hole injection layer may also be made of a mixture of a hole transport material (host material) and a p-type dopant material, wherein a doping concentration of the p-type dopant material is 0.5%~10%. For example, a material of the hole injection layer may be a material formed by doping $F_4TCNQ$ (2, 3, 5, 6-tetrafluoro-7, 7', 8, 8'-tetracyanoquinodimethane) into NPB (N, N'-bis (1-naphthyl)-N, N'-diphenyl-1, 1'-biphenyl-4-4'-diamine), i.e., NPB: F4TCNQ, or a material formed by doping $MoO_3$ (molybdenum trioxide) into TAPC (4, 4'-cyclohexylbis [N, N-bis (4-methylphenyl) aniline]), i.e., TAPC: MoO3. A thickness of the hole injection layer may be 5 nm to 20 nm. The hole injection layer 304 may decrease a hole injection potential barrier from the anode and improve a hole injection efficiency.

Illustratively, a material of the hole transport layer may be a carbazole-type material or the like with higher hole mobility. The highest occupied molecular orbital (HOMO) energy level of the hole transport layer may be between −5.2 eV and −5.6 eV. A thickness of the electron transport layer may be 100 nm to 200 nm. A function of the hole transport layer is to improve the hole transport rate, and also to decrease the hole injection potential barrier and improve the hole injection efficiency.

Illustratively, a main function of the electron block layer is to transfer holes and block electrons as well as excitons generated in the light emitting layer. A material of the electron block layer may be a carbazole-type material or the like. The electron block layer of the sub-pixel of each color may be manufactured using an evaporation process individually, and a thickness of the electron block layer of the blue sub-pixel may be 1 nm to 10 nm. A thickness of the electron block layer of the red sub-pixel may be 40 nm to 60 nm. A thickness of the electron block layer of the green sub-pixel may be 15 nm to 30 nm.

Illustratively, the light emitting layer may include a host material responsible for charge transport and a guest material responsible for emitting light, and the color of emitted light and spectral characteristics of the light emitting layer are mainly determined by the guest material. Alternatively, the material of the light emitting layer may be a delayed fluorescence material system, and the material of the light emitting layer may also include a sensitizer having delayed fluorescence characteristics. The light emitting layer of the sub-pixel of each color can be manufactured using an evaporation process individually. A thickness of the light emitting layer of the blue sub-pixel may be 15 nm to 25 nm. A thickness of the light emitting layer of the red sub-pixel may be 25 nm to 40 nm. A thickness of the light emitting layer of the green sub-pixel may be 25 nm to 40 nm.

Illustratively, a material of the hole block layer may be a derivative such as azine, imidazole, etc. A main function of the hole block layer is to transfer electrons and prevent holes and excitons generated in the light emitting layer from migrating towards one side at which the cathode is located. The thickness of the hole block layer may be 2 nm to 10 nm.

Illustratively, the electron transport layer may be manufactured by mixing a thiophene-type, imidazole-type or azine-type derivative with quinoline lithium, wherein a proportion of the quinoline lithium may be 30% to 70%. The thickness of the electron transport layer may be 20 nm to 40 nm.

Illustratively, a material of the electron injection layer may be 8-hydroxyquinoline lithium (Liq), lithium fluoride (LiF), lithium (Li), ytterbium (Yb), magnesium (Mg) or calcium (Ca). The thickness of the electron injection layer may be 0.5 nm to 2 nm. The electron injection layer 13 may decrease the electron injection potential barrier and improve the electron injection efficiency.

An embodiment of the present disclosure further provides a display device, which includes the display substrate according to any one of the previous embodiments. The display device may be any product or component with a display function, such as a mobile phone, a tablet computer, a television, a display, a laptop computer, a digital photo frame, a navigator, etc.

Sometimes for the sake of clarity, a size of a constituent element, a thickness of a layer or a region in the drawings may be exaggerated. Therefore, one implementation of the present disclosure is not necessarily limited to the size, and the shape and size of each component in the drawings do not reflect actual scales. In addition, the drawings schematically illustrate some examples, and one implementation of the present disclosure is not limited to the shapes or numerical values shown in the drawings.

In the description herein, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 80° and less than 100°, and thus also includes a state in which the angle is greater than 85° and less than 95°.

In the description herein, orientation or position relationships indicated by the terms such as "upper", "lower", "left", "right", "top", "inside", "outside", "axial", "tetragonal" and the like are orientation or position relationships shown in the drawings, and are intended to facilitate description of the embodiments of the present disclosure and simplification of the description, but not to indicate or imply that the mentioned structure has a specific orientation or be constructed and operated in a specific orientation, therefore, they should not be understood as limitations on the present disclosure.

In the description herein, unless otherwise specified and defined explicitly, the terms "connection", "fixed connection", "installation" and "assembly" should be understood in a broad sense, and, for example, may be a fixed connection, a detachable connection or an integrated connection; the terms "installation", "connection" and "fixed connection" may be a direct connection, an indirect connection through intermediate components, or communication inside two components. For those ordinarily skilled in the art, the meanings of the above terms in the embodiments of the present disclosure can be understood according to situations.

The invention claimed is:

1. A display substrate, which comprises a light emitting element disposed on a base substrate, and an encapsulation layer, a connection layer, a light extraction layer, a polarization conversion layer and a polarization layer which are stacked sequentially at a light exiting side of the light emitting element,
wherein the light extraction layer is configured to convert at least a portion of light which is emitted by the light emitting element and incident onto the light extraction layer into circularly polarized light with a set rotational direction to pass through the light extraction layer;
the polarization conversion layer is configured to convert the circularly polarized light passing through the light extraction layer into linearly polarized light, wherein a polarization direction of the linearly polarized light is parallel to a direction of a light transmission axis of the polarization layer; and
the connection layer is configured to bond the light extraction layer to the encapsulation layer, a thickness of the connection layer is greater than 3 times of a thickness of the light extraction layer, and a difference between a refractive index of the connection layer and a refractive index of a film layer of the encapsulation layer close to the connection layer is greater than 0.25.

2. The display substrate according to claim 1, wherein the refractive index of the connection layer is 1.35 to 1.65, and the thickness of the connection layer is 5 μm to 40 μm.

3. The display substrate according to claim 1, wherein the light emitting element comprises an anode, a light emitting layer and a cathode which are stacked sequentially along a direction away from the base substrate; and
the light extraction layer is further configured to convert another portion of the light which is emitted by the light emitting element and incident onto the light extraction layer into circularly polarized light with a rotational direction opposite to the set rotational direction and reflect the light, wherein the circularly polarized light with the rotational direction opposite to the set rotational direction reflected off the light extraction layer is converted into circularly polarized light which has a same rotational direction as the set rotational direction after being reflected off the cathode and is able to pass through the light extraction layer.

4. The display substrate according to claim 1, wherein the light extraction layer comprises a cholesteric liquid crystal material.

5. The display substrate according to claim 1, wherein the light extraction layer is configured to convert light in a wavelength range from 400 nm to 500 nm into circularly polarized light with the set rotational direction to pass through the light extraction layer; and
transmittance of the light extraction layer to light in the wavelength range from 400 nm to 500 nm is 35% to 65%, and transmittance of the light extraction layer to light with a wavelength greater than 500 nm is larger than 90%.

6. The display substrate according to claim 1, wherein the polarization conversion layer is a quarter-wave phase retardation film, which has inverse wavelength dispersion.

7. The display substrate according to claim 6, wherein the quarter-wave phase retardation film satisfies: $0.78<R_B/R_0<1.1$, $0.9<R_G/R_0<1.1$, and $1<R_R/R_0<1.1$,
wherein $R_0$ is an optical path difference between o light and e light occurring after birefringence of incident light of a central wavelength by the quarter-wave phase retardation film; $R_B$ is an optical path difference between o light and e light occurring after birefringence of incident blue light by the quarter-wave phase retardation film; $R_G$ is an optical path difference between o light and e light occurring after birefringence of incident green light by the quarter-wave phase retardation film; $R_R$ is an optical path difference between o light and e light occurring after birefringence of incident red light by the quarter-wave phase retardation film.

8. The display substrate according to claim 6, further comprising a half-wave phase retardation film disposed between the polarization conversion layer and the polarization layer.

9. The display substrate according to claim 8, wherein the polarization layer, the half-wave phase retardation film and the polarization conversion layer satisfy $\beta-2\alpha=45°$,
wherein $\alpha$ is an angle between an optical axis of the half-wave phase retardation film and a light transmission axis of the polarization layer, and $\beta$ is an angle between an optical axis of the polarization conversion layer and the light transmission axis of the polarization layer; or $\alpha$ is an angle between the optical axis of the half-wave phase retardation film and an absorption axis of the polarization layer, and $\beta$ is an angle between the optical axis of the polarization conversion layer and the absorption axis of the polarization layer.

10. The display substrate according to claim 1, wherein the encapsulation layer comprises three or more stacked film layers, a difference between a refractive index of at least one of the film layers in the encapsulation layer and the refractive index of the connection layer is less than or equal to 0.2, and refractive indexes of at least two of the film layers in the encapsulation layer are greater than 1.65.

11. The display substrate according to claim 1, wherein the light emitting element comprises an anode, a light emitting layer and a cathode stacked sequentially along a direction away from the base substrate; and the display substrate further comprises a covering layer disposed between the cathode and the encapsulation layer, the difference between the refractive index of the covering layer and the refractive index of the film layer of the encapsulation layer close to the covering layer is greater than 0.1.

12. The display substrate according to claim 1, further comprising a display region which comprises a plurality of pixel units arranged in an array, wherein the pixel units comprises a red sub-pixel R, a green sub-pixel G and a blue sub-pixel B, and each sub-pixel comprises a light emitting element; and any one of the encapsulation layer, the connection layer, the light extraction layer, the polarization conversion layer and the polarization layer of all sub-pixels in the display region is connected to form an integrated structure and covers the display region.

13. The display substrate according to claim 1, wherein the encapsulation layer comprises a plurality of film layers stacked, and a refractive index of the encapsulation layer increases and decreases alternately along a direction away from the base substrate.

14. The display substrate according to claim 13, wherein the light emitting element comprises an anode, a light emitting layer and a cathode stacked sequentially along the direction away from the base substrate;

the display substrate further comprises a covering layer disposed between the cathode and the encapsulation layer;

the encapsulation layer comprises a first inorganic encapsulation layer, an organic encapsulation layer and a second inorganic encapsulation layer that are stacked sequentially along the direction away from the base substrate; and the first inorganic encapsulation layer comprises one or more film layers, a refractive index of the first inorganic encapsulation layer is greater than a refractive index of the organic encapsulation layer when the first inorganic encapsulation layer comprises one film layer; a refractive index of a film layer in the first inorganic encapsulation layer close to the organic encapsulation layer is greater than the refractive index of the organic encapsulation layer when the first inorganic encapsulation layer comprises a plurality of film layers.

15. The display substrate according to claim 14, wherein the first inorganic encapsulation layer comprises one film layer;

the refractive index of the first inorganic encapsulation layer is greater than a refractive index of the covering layer; or the covering layer comprises a first sub-covering layer and a second sub-covering layer which are stacked sequentially along the direction away from the base substrate, a refractive index of the first sub-covering layer is greater than a refractive index of the second sub-covering layer, and the refractive index of the second sub-covering layer is less than the refractive index of the first inorganic encapsulation layer.

16. The display substrate according to claim 15, wherein a material of the covering layer is an aromatic amine-type or azine-type organic material, a material of the first inorganic encapsulation layer is silicon nitride or silicon oxynitride, a material of the organic encapsulation layer is a resin material, and a material of the second inorganic encapsulation layer is silicon nitride or silicon oxynitride.

17. The display substrate according to claim 14, wherein the first inorganic encapsulation layer comprises a first sub-inorganic encapsulation layer and a second sub-inorganic encapsulation layer that are stacked sequentially along the direction away from the base substrate, and a refractive index of the first sub-inorganic encapsulation layer is less than a refractive index of the second sub-inorganic encapsulation layer; and a refractive index of the covering layer is greater than the refractive index of the first sub-inorganic encapsulation layer.

18. The display substrate according to claim 17, wherein a material of the first sub-inorganic encapsulation layer is lithium fluoride or silicon dioxide, a material of the second sub-inorganic encapsulation layer is silicon nitride or silicon oxynitride, a material of the organic encapsulation layer is a resin material, and a material of the second inorganic encapsulation layer is silicon nitride or silicon oxynitride; and a material of the covering layer is an aromatic amine-type or azine-type organic material.

19. The display substrate according to claim 1, wherein a refractive index of one of any two adjacent film layers in the encapsulation layer is 1.3 to 1.7, and a refractive index of the other of the two film layers is 1.7 to 2.3.

20. A display device comprising the display substrate according to claim 1.

* * * * *